United States Patent
Tanimoto

(10) Patent No.: US 7,329,614 B2
(45) Date of Patent: Feb. 12, 2008

(54) HEAT RESISTANT OHMIC ELECTRODE AND METHOD OF MANUFACTURING THE SAME

(75) Inventor: Satoshi Tanimoto, Yokohama (JP)

(73) Assignee: Nissan Motor Co., Ltd., Kanagawa-Ken (JP)

( * ) Notice: Subject to any disclaimer, the term of this patent is extended or adjusted under 35 U.S.C. 154(b) by 0 days.

(21) Appl. No.: 11/592,165

(22) Filed: Nov. 3, 2006

(65) Prior Publication Data

US 2007/0045782 A1  Mar. 1, 2007

Related U.S. Application Data

(62) Division of application No. 11/069,997, filed on Mar. 3, 2005, now Pat. No. 7,135,774.

(30) Foreign Application Priority Data

Mar. 17, 2004  (JP) .............................. 2004-076680

(51) Int. Cl.
*H01L 21/469* (2006.01)

(52) U.S. Cl. .................. 438/768; 438/128; 438/522

(58) Field of Classification Search ............. 438/128, 438/768, 765, 766, 767, 518, 522, 523; 257/E21.062, 257/E21.063

See application file for complete search history.

(56) References Cited

U.S. PATENT DOCUMENTS

| | | |
|---|---|---|
| 4,933,743 A | 6/1990 | Thomas et al. |
| 5,381,046 A | 1/1995 | Cederbaum et al. |
| 5,773,890 A | 6/1998 | Uchiyama et al. |
| 5,990,513 A | 11/1999 | Perino et al. |
| 6,020,640 A | 2/2000 | Efland et al. |
| 6,429,526 B1 | 8/2002 | Blalock et al. |
| 2004/0017010 A1 | 1/2004 | Sohn et al. |
| 2004/0150108 A1 | 8/2004 | Buerke et al. |

FOREIGN PATENT DOCUMENTS

| | | |
|---|---|---|
| JP | 8-064801 | 3/1996 |
| JP | 2002-093742 A | 3/2002 |

*Primary Examiner*—Zandra V. Smith
*Assistant Examiner*—Seth Barnes
(74) *Attorney, Agent, or Firm*—McDermott Will & Emery LLP

(57) ABSTRACT

An aspect of the present invention provides an ohmic electrode that includes an SiC (silicon carbide) substrate, an impurity region selectively formed in a surface of the SiC substrate, an insulating film formed on the surface of the SiC substrate, a contact hole opened through the insulating film, to expose a surface of the impurity region, a conductive thermal reaction layer formed in the contact hole in contact with the impurity region, a conductive plug formed to fill the contact hole, an metal wiring formed on the insulating film and electrically coupled to the plug, and a diffusion preventive layer formed between the metal wiring and the plug to electrically couple the plug with the metal wiring, the diffusion preventive layer configured to prevent the diffusion of metal atoms from the metal wiring.

6 Claims, 7 Drawing Sheets

HEAT RESISTANT OHMIC ELECTRODE AND METHOD OF MANUFACTURING THE SAME

RELATED APPLICATIONS

This application is a divisional of application Ser. No. 11/069,997, filed on Mar. 3, 2005 now U.S. Pat. No. 7,135,774, which in turn claims the benefit of Japanese Patent Application No. 2004-076680, filed on Mar. 17, 2004, the disclosures of which Applications are incorporated by reference herein.

BACKGROUND OF THE INVENTION

The present invention relates to an ohmic electrode of a semiconductor device employing a silicon carbide (SiC) substrate and a method of manufacturing the ohmic electrode.

An important factor in lowering the ON-resistance of a power device employing SiC is lowering the contact resistance and the resistance of wiring. To realize low ON-resistance, a related art divides a main electrode area of a power device into small sections and densely arranges the divided sections on an SiC substrate. To reduce the ON-resistance of such a fine power device, what is required is to stabilize and decrease the contact resistance ρc and wiring resistance of an opening (contact hole) formed through an insulating film. Reducing these resistance values relative to that of the SiC region is also important to improve the switching speed of the power device.

A related art widely used for forming a low-resistance ohmic contact employs nickel (Ni), tungsten (W), titanium (Ti), aluminum (Al), or the like as an electrode film raw material, deposits the raw material over a high-concentration impurity region on an SiC substrate, heat-treats the substrate at a high temperature of 800° C. to 1200° C. to cause a solid phase reaction between the raw material and SiC, and thereby forms a thermally-reacted layer between the raw material and the high-concentration impurity region. The area between the thermally-reacted layer and the high-concentration impurity region has a proper ohmic property. An ohmic contact employing Ni among the raw materials can provide a contact resistance value ρc on the order of $10^{-6}$ $\Omega cm^2$ that is practical for an n-type SiC region. This is a promising ohmic contact. For a p-type SiC region, an ohmic contact made from a multilayer film of, for example, Ti/Al is usable. Examples of ohmic electrodes employing an Ni film are disclosed in Japanese Laid-open Patent Publications No. Hei-8-64801 and No. 2002-93742.

SUMMARY OF THE INVENTION

According to studies conducted by the present inventors, ohmic electrodes based on the related arts mentioned above cause the following problems when operated or left at high temperatures for a long time:

(1) a resistance increase and a resultant breakage in Al wiring connected to a contact of the ohmic electrode; and (2) a deterioration and a gradual resistance increase in a contact in an n-type region of the ohmic electrode.

The problem (1) is common to contacts in both p- and n-type regions. The problem (2) is specific to a contact in an n-type region. The "high temperatures" mentioned above are, for example, temperatures above 300° C. at which silicon (Si) devices are unable to operate.

After finding the problems, the present inventors have continued studies and have found that Al wiring formed along the side wall of a contact hole is thinner than that formed along a planar area, is subjected to severe high temperatures and large current density that are unimaginable for Si semiconductor devices, and thereby causes electromigration that rapidly thins and finally breaks the Al wiring. The inventors have concluded that this is the reason that causes the problem of increasing the resistance of Al wiring and finally breaking the same.

The inventors have also clarified the cause of the contact resistance increase problem in an n-type region. It occurs because high temperatures cause Al atoms in Al wiring to slowly diffuse through a thermal reaction raw material and a thermally-reacted layer into a lower $n^+$ region (high-impurity-concentration n-type SiC region). As is known, Al atoms in SiC work as acceptors, and therefore, the Al acceptors diffusing into the $n^+$ region compensate for donors in the $n^+$ region to reduce the density of effective donor atoms and increase contact resistance.

An object of the present invention is to separately or simultaneously solve the two problems related to the conventional ohmic electrode and provide an ohmic electrode capable of resisting high temperatures.

In order to accomplish the object, the present invention forms a contact plug in a contact hole formed through an insulating film of a semiconductor device, the contact plug being formed by filling the contact hole with a conductive material whose electromigration resistance is higher than Al. The present invention may form an Al diffusion preventive layer between the contact plug and Al wiring. Alternatively, the present invention may provide the contact plug itself with an Al diffusion preventive function.

An aspect of the present invention provides an ohmic electrode that includes an SiC (silicon carbide) substrate, an impurity region selectively formed in a surface of the SiC substrate, an insulating film formed on the surface of the SiC substrate, a contact hole opened through the insulating film, to expose a surface of the impurity region, a conductive thermal reaction layer formed in the contact hole in contact with the impurity region, a conductive plug formed to fill the contact hole, a metal wiring formed on the insulating film and electrically coupled to the plug, and a diffusion preventive layer formed between the metal wiring and the plug to electrically couple the plug with the metal wiring, the diffusion preventive layer configured to prevent the diffusion of metal atoms from the metal wiring.

Another aspect of the present invention provides an ohmic electrode that includes an SiC (silicon carbide) substrate, an impurity region selectively formed in a surface of the SiC substrate, an insulating film formed on the surface of the SiC substrate, a contact hole opened through the insulating film, to expose a surface of the impurity region, a conductive thermal reaction layer formed in the contact hole in contact with the impurity region, a conductive diffusion preventive plug formed in contact with the conductive thermal reaction layer and formed to fill the contact hole, the diffusion preventive plug configured to prevent the diffusion of metal atoms from the metal wiring, and a metal wiring formed on the insulating film and electrically coupled to the diffusion preventive plug.

Furthermore, another aspect of the present invention provides a method of manufacturing an ohmic electrode that includes forming a high-concentration impurity region in an area at a surface of an SiC substrate by implanting conductive impurities into the area, forming an insulating film over the surface of the SiC substrate including the high-concentration impurity region, opening a contact hole through the insulating film, to expose a surface of the high-concentration impurity region, arranging a conductive thermal reaction raw material in the contact hole over the surface of the high-concentration impurity region, forming a thermally-reacted layer from the thermal reaction raw material by heat-treating the SiC substrate in a non-oxidizing atmosphere, the thermally-reacted layer being conductive and interposed between the thermal reaction raw material and the high-concentration impurity region, forming a plug by filling the contact hole with a conductive material up to the surface of the insulating film, the plug preventing the diffusion of metal atoms, and forming metal wiring to cover the plug.

DETAILED DESCRIPTION OF EMBODIMENTS

Figure 1:
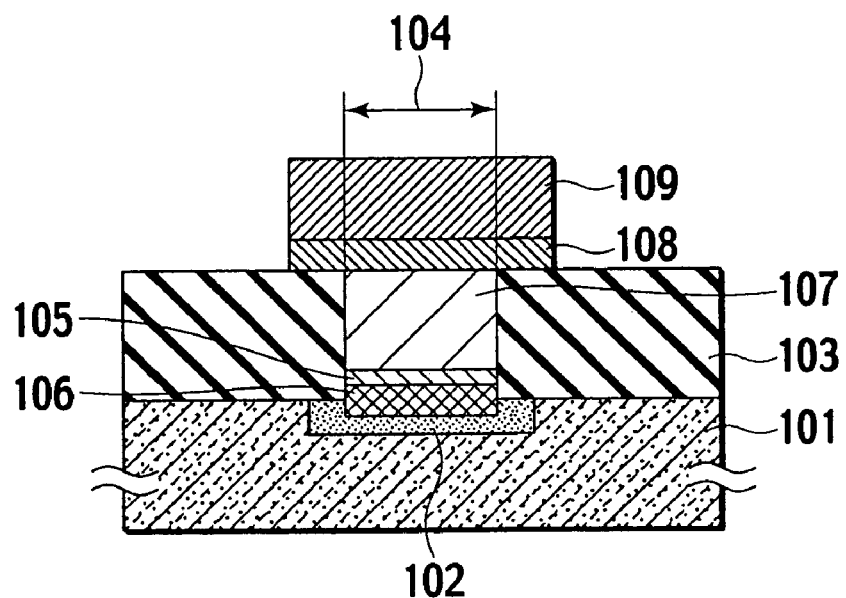
FIG. 1 is a sectional view partly showing an SiC ohmic electrode according to a first embodiment of the present invention.

Various embodiments of the present invention will be described with reference to the accompanying drawings. It is to be noted that same or similar reference numerals are applied to the same or similar parts and elements throughout the drawings, and the description of the same or similar parts and elements will be omitted or simplified.

All of the drawings show only typical examples in which thicknesses, two-dimensional sizes, layer thicknesses, relationships among them, and the like may differ from actual ones. Practical thicknesses and other dimensions must be determined by studying the following explanation. It must also be noted that the thicknesses, sizes, relationships among them, and the like may differ from one drawing to another.

First Embodiment

FIG. 1 is a sectional view partly showing an SiC ohmic electrode according to a first embodiment of the present invention. The SiC ohmic electrode has an SiC substrate 101 and a high-concentration n- or p-type impurity region 102 formed at a part of a surface of the SiC substrate 101. The impurity region 102 has an impurity concentration of at least $1 \times 10^{18}/cm^3$ or more, preferably $1 \times 10^{19}/cm^3$ or more. The conductivity type of the SiC substrate 101 depends on a semiconductor device that employs the ohmic electrode.

SiC is capable of forming a pn junction and has a wider forbidden band width Eg than other semiconductor materials such as silicon (Si) and gallium arsenide (GaAs). In addition, SiC is thermally, chemically, and physically stable and is resistive to radiation. Accordingly, SiC is used in various industries to form, for example, light emitting diodes, high-frequency devices, and power semiconductor devices that must be reliable and stable under severe conditions including high temperatures, high electric power, and radiation.

On the SiC substrate 101, an insulating film 103 having a thickness of 100 nm to 3 μm is formed. Low contact resistance is obtainable by providing the insulating film 103 with a multilayer structure. An example of a multilayer structure includes a thermal oxide film ($SiO_2$) and an upper insulating film deposited on the $SiO_2$ film by another technique. The insulating film 103, however, is not limited to such a multilayer film. A concrete example of a multilayer insulating film may include a thermal oxide film grown by dry oxidization at 1100° C. and, as an upper insulating film, a PSG (phosphorus silicate glass) film or an $SiO_2$ film formed by CVD (chemical vapor deposition). The thickness of the lower thermal oxide film is below 50 nm, preferably, in the range of 5 to 20 nm.

The insulating film 103 has a contact hole 104 reaching the high-concentration impurity region 102 in the SiC substrate 101. At the bottom of the contact hole 104, a thermally-reacted layer 106 is formed in contact with the impurity region 102. On the thermally-reacted layer 106, there is an unreacted thermal reaction raw material 105. The thermally-reacted layer 106 is a conductive contact layer and is produced through thermal solid phase reaction between the SiC substrate 101 and the thermal reaction raw material 105. According to the first embodiment, the unreacted thermal reaction raw material 105 lies on the thermally-reacted layer 106. The raw material 105 may not be left, to leave only the thermally-reacted layer 106. An optimum material may be selected for the thermal reaction raw material 105, to provide the contact with low electrical resistance, heat resistance, and processing resistance. For example, the thermal reaction raw material 105 may contain an element selected from the group consisting of Ni, Ti, Cr, Ta, W, Mo, Co, and Al and may take a form selected from the group consisting of metal film, alloy film, compound film, composite film, and layered film containing at least one of those elements.

The contact hole 104 is filled with a plug 107. The plug 107 is in contact with the thermal reaction raw material 105 (or the thermally-reacted layer 106 if the raw material 105 is not left). The plug 107 is made of a conductive material whose electromigration resistance is higher than that of Al. For example, the plug 107 is made of Cu although this does not limit the present invention.

A practical range of the cross-sectional conductor area of the plug 107 is from 0.3 μm² to 80 μm². If an aspect ratio (height/traverse length) of the plug 107 is more than or equal to one (1), finer semiconductors and fewer the ON-resistance of the electrode are realized. Furthermore, thinner the plug 107 leads to flexibility in manufacturing processing afterward and then reducing the cost of the manufacturing can be realized.

Above the plug 107 and insulating film 103, there is arranged metal wiring 109. In this embodiment Al (aluminum) wiring is used as the metal wiring 109. The Al wiring 109 may be made of pure Al or eutectic alloy such as Al—Si and Al—Cu to connect the plug 107 to other plugs. The term "Al wiring" includes wirings that contain at least Al, such as wiring made of Al—Si eutectic alloy or Al—Cu alloy.

A diffusion preventive conductive layer 108 is formed to physically isolate the plug 107 and Al wiring 109 from each other. The diffusion preventive layer 108 prevents the diffusion of Al atoms from the Al wiring 109 to the high-concentration impurity region 102 at high temperatures as well as preventing a chemical reaction of the Al wiring 109 and plug 107. The diffusion preventive layer 108 may be a film of nitrides, carbides, or alloys of a material selected from a group consisting of Zr, Ti, Hf, Ta, and W. The diffusion preventive layer 108 may also be a film selected from a group consisting of a single-layer film, multilayer film, and composite film. The film to be selected is made of at least one material selected from a group consisting of Pt, Ti, Hf, Ta, W, Ir, Re, Os, and Rh. Material for the diffusion preventive layer 108 is not limited to them, any other material that can provide the required functions is usable for the diffusion preventive layer 108.

Figure 8:
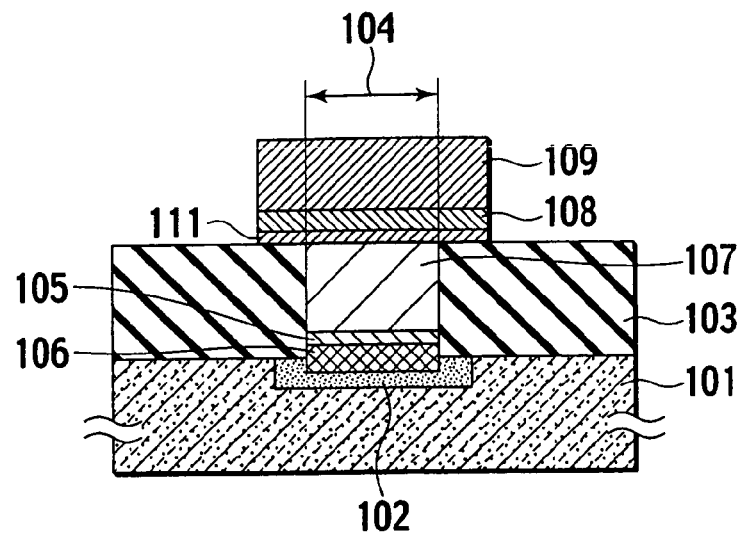
FIG. 8 is another sectional view partly showing an SiC ohmic electrode according to a first embodiment of the present invention.

If the diffusion preventive layer 108 has insufficient adhesiveness with respect to the insulating film 103, the bottom of the diffusion preventive layer 108 may be provided with a thin conductive adhesion promoting layer 111 (FIG. 8) having good adhesiveness. If the diffusion preventive layer 108 is made of TaN, for example, the adhesion promoting layer may be a highly adhesive thin Ta film on which the TaN diffusion preventive layer 108 is formed.

(Method of Manufacturing Ohmic Electrode)

Figure 2A:
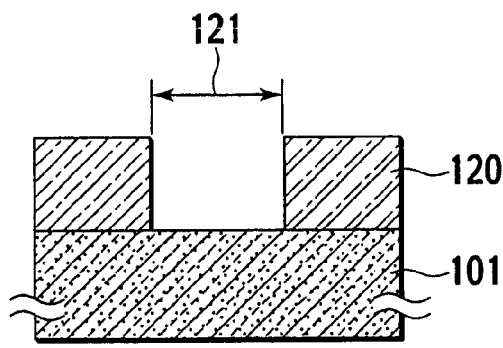
FIGS. 2A to 2D are sectional views for explaining a method of manufacturing ohmic electrode according to a first embodiment of the present invention.

A method of manufacturing the ohmic electrode shown in FIG. 1 will be explained with reference to FIGS. 2A to 4B. In FIG. 2A, an ion implantation mask film 120 of $SiO_2$ with about 1.5 µm thick is deposited by CVD over the surface of an SiC substrate 101. A part 121 of the mask 120 where a high-concentration impurity region 102 is to be formed is opened by known photolithography and etching. A thin film 122 of $SiO_2$ is entirely deposited by CVD. The film 122 is used to adjust a projection range (depth) of implanting ions. If the ions to implant are phosphorus ions, the thickness of the through film 122 will be 20 to 25 nm.

Figure 2C:
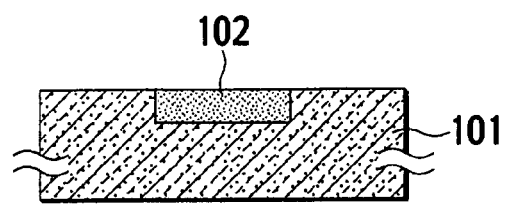
Figure 2B:
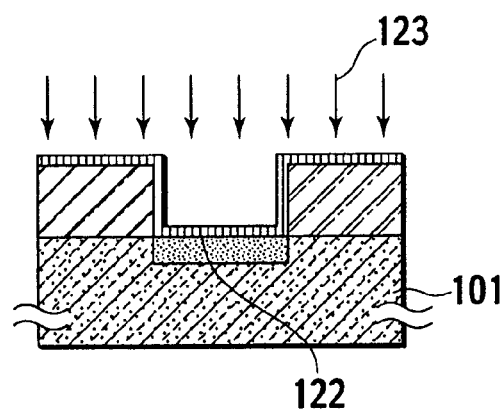
Figure 2D:
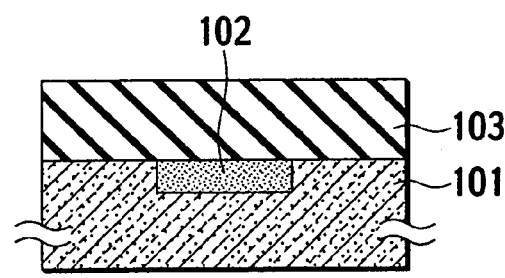

After depositing the $SiO_2$ film 122, impurity ions 123 are implanted as shown in FIG. 2B. The concentration of the impurity ions 123 is selected to provide a required conductivity for the substrate 101 and not to deteriorate the crystal structure of SiC. It is preferred that the impurity is $1\times10^{20}$/$cm^3$ or larger in concentration to realize sufficiently low contact resistance.

For example, multi-energy implantation technique of following conditions (dose/acceleration energy) can be applied to implant P (phosphorus) ions into the SiC substrate 101 heated to 500° C. to form a low-resistance n-type region.

$5\times10^{14}$ cm$^{-2}$/40 kev $5\times10^{14}$ cm$^{-2}$/70 kev $1\times10^{14}$ cm$^{-2}$/100 kev $1\times10^{15}$ cm$^{-2}$/150 kev $2\times10^{15}$ cm$^{-2}$/200 kev $2\times10^{15}$ cm$^{-2}$/250 kev After the ion implantation, the $SiO_2$ ion implantation mask film 120 and film 122 are entirely removed by hydrofluoric (HF) solution, and a rapid thermal annealing is carried out at 1700° C. for one minute in an Ar atmosphere under a normal pressure. This sufficiently activates the implanted ion impurities to form the high-concentration impurity region 102 at the predetermined part of the SiC substrate 101 as shown in FIG. 2C. The depth of the n$^+$-type SiC region formed by the P-ion implantation and activation annealing is about 350 nm.

The SiC substrate 101 is sufficiently washed by RCA cleaning that is a conventional semiconductor substrate washing technique employing a combination of $H_2O_2$+$NH_4OH$ mixture liquid, SC-1 and $H_2O_2$+HCl mixture liquid, and SC-2 immersion. Then, the SiC substrate 101 is dry-oxidized in an oxygen atmosphere to grow a thermal oxide film of 10 nm thick. On this film, an upper insulating film such as PSG is deposited to 1000 nm thick by CVD under the atmospheric pressure. This forms a two-layer thick insulating film 103 shown in FIG. 2D. As mentioned above, it is not always necessary to form the insulating film 103 as a multilayer film.

Figure 3A:
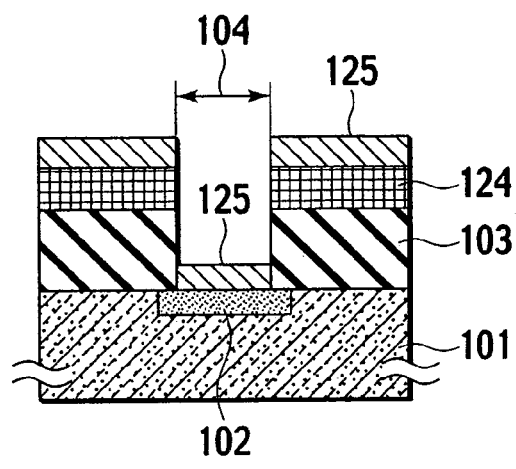
FIGS. 3A to 3D are sectional views for explaining a method of manufacturing ohmic electrode according to a first embodiment of the present invention.

In FIG. 3A, a photoresist 124 of 1 to 2 µm thick is coated on the surface of the insulating film 103. The surface of the photoresist 124 is selectively exposed and developed to remove a part of the photoresist 124 corresponding to a contact hole 104. Then, the contact hole 104 is opened through the insulating film 103 by etching which may be reactive ion etching (RIE) employing $CF_4$ gas plasma, or a combination of RIE and wet etching using buffered hydrofluoric solution.

A buffered hydrofluoric solution for opening the contact hole 104 is completely washed with ultrapure water. The SiC substrate 101 with the photoresist 124 is dried and is immediately set in a vacuum deposition apparatus that maintains a high vacuum. In the vacuum deposition apparatus, a thermal reaction raw material 125 of Ni is deposited over the substrate 101 to, for example, 50 nm thick.

An interval and atmosphere between the contact hole etching and the electrode film deposition are important factors that determine contact resistance. If the interval is long, a natural oxide film will be produced on the SiC surface in the contact hole, or hydrocarbon will again adhere thereto. If this happens, a thermally-reacted layer will irregularly be formed and the contact resistance will drastically increase. Accordingly, it is preferable to cover the contact hole with the thermal reaction raw material 125 as quickly as possible.

The SiC substrate 101 is immersed in an organic solution such as an acetone solution or an exclusive photoresist removing liquid, to completely remove the photoresist 124 remaining on the surface of the substrate. At this time, the thermal reaction raw material 125 on the photoresist 124 is also removed, to provide a substrate structure with the thermal reaction raw material 125 remaining only at the bottom of the contact hole 104 as shown in FIG. 3B.

Figure 3C:
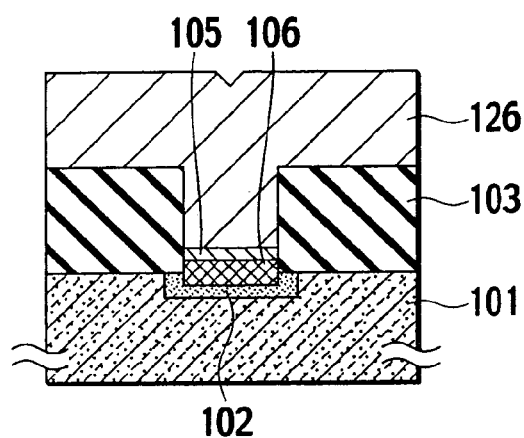
Figure 3B:
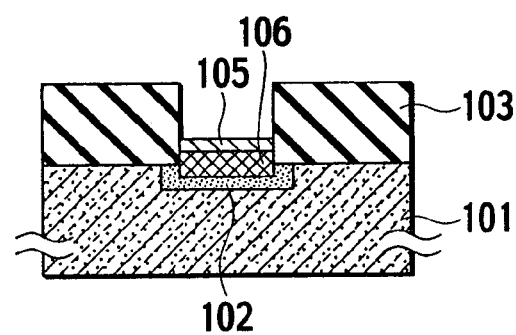

The SiC substrate 101 shown in FIG. 3B is annealed for a short time in a non-oxidizing atmosphere. Then, the thermal reaction raw material 125 at the bottom of the contact hole 104 partly carries out solid phase reaction with the SiC substrate 101 to form a thermally-reacted layer 106. The remaining unreacted part is left as a thermal reaction raw material 105. An atmosphere appropriate for producing the thermally-reacted layer 106 is an inert gas (for example, Ar gas) atmosphere with a partial pressure of oxygen or oxygen containing gas (such as water vapor or carbon dioxide) of below $1\times10^{-5}$ Torr, preferably, below $1\times10^{-7}$ Torr, or a vacuum. If the thermal reaction raw material 105 is thin, it will disappear at this time, to provide a structure without the thermal-reaction raw material 105.

Figure 9:
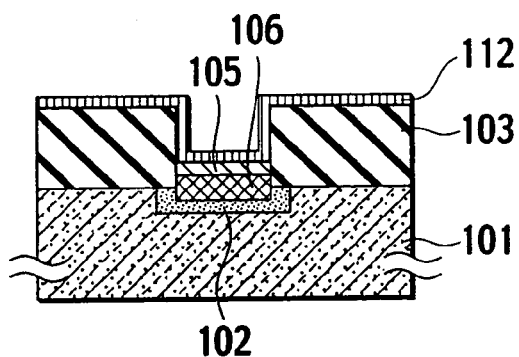
FIG. 9 is a sectional view for explaining a method of manufacturing ohmic electrode employing an adhesive promoting layer according to a first embodiment of the present invention.
Figure 10:
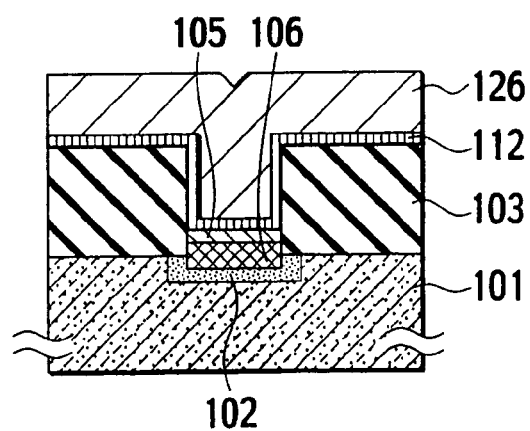
FIG. 10 is a sectional view for explaining a method of manufacturing ohmic electrode employing an adhesion-deposition promoting layer according to a first embodiment of the present invention.

In FIG. 3C, a thick plug material 126 such as Cu (copper) is conformally deposited on the surface of the SiC substrate 101, to completely fill the contact hole 104. This deposition is carried out by low-pressure chemical vapor deposition (metal-organic (MO) CVD) or by electrolytic plating. When using electrolytic plating, an adhesive promoting layer may be formed beforehand, to stabilize deposition of the plug material 126 and promote adhesion between the plug 107 and the insulating film 103 and thermal reaction raw material 105 or thermally-reacted layer 106. In this case, before the electrolytic plating, as shown in FIG. 9, a thin seed layer 112 (for example, a Ti/TiN/Cu multilayer) serving as an electrode may be formed allover the SiC substrate 101 by DC magnetron spattering. And then, as shown in FIG. 10 plug material 126 is deposited on the seed layer 112. In this case, the term "plug" includes the seed layer. When employing MOCVD to form the plug material 126. a seed layer of Ti/TiN may be formed before conducting MOCVD, to enhance adhesion between the plug 107 and the thermal reaction raw material 105 (or thermally-reacted layer 106) and insulating film 103. This seed layer differs from that for the electrolytic plating. In this case also, the term "plug" includes the seed layer.

According to a modification of this embodiment, the seed layer may include a diffusion preventive material to be explained later. This modification provides the effect of a diffusion preventive layer 108 to be explained later and realizes an ohmic electrode capable of preventing Al-atom diffusion even at high temperatures.

Figure 3D:
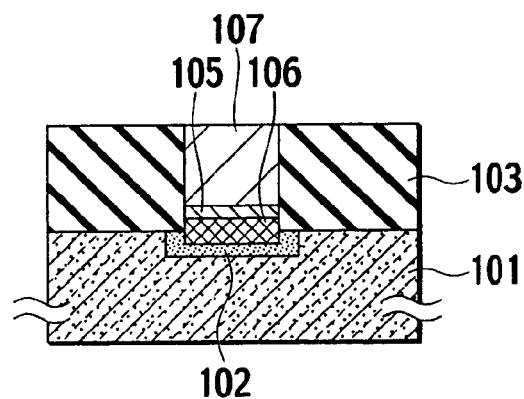

In FIG. 3D, the SiC substrate 101 is polished by chemical mechanical polishing (CMP) to remove the plug material 126 from the surface of the insulating film 103, thereby forming the plug 107. If the plug 107 includes a seed layer, the seed layer on the insulating film 103 is also removed by CMP. After CMP, the SiC substrate 101 is sufficiently washed to completely remove abrasive particles and polished dust.

Figure 4A:
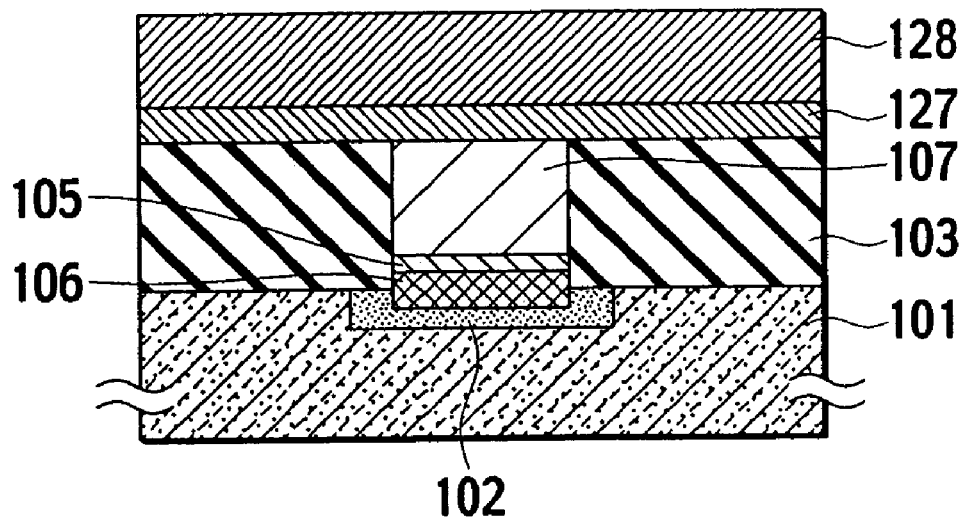
FIGS. 4A and 4B are sectional views for explaining a method of manufacturing ohmic electrode according to a first embodiment of the present invention.

In FIG. 4A, a diffusion preventive layer material 127 (for example, TaN of 150 nm thick) and an Al wiring material 128 (for example, Al—Si eutectic alloy of 1 µm thick) are formed. Before the formation of the diffusion preventive layer material 127 and Al wiring material 128, an adhesion promoting layer (for example, Ta of 50 nm thick) may be formed to promote adhesion between the diffusion preventive layer material 127 and the insulating film 103. The diffusion preventive layer material 127 and adhesion promoting layer form a multilayer film. The adhesion promoting layer may be formed by DC magnetron spattering.

Figure 4B:
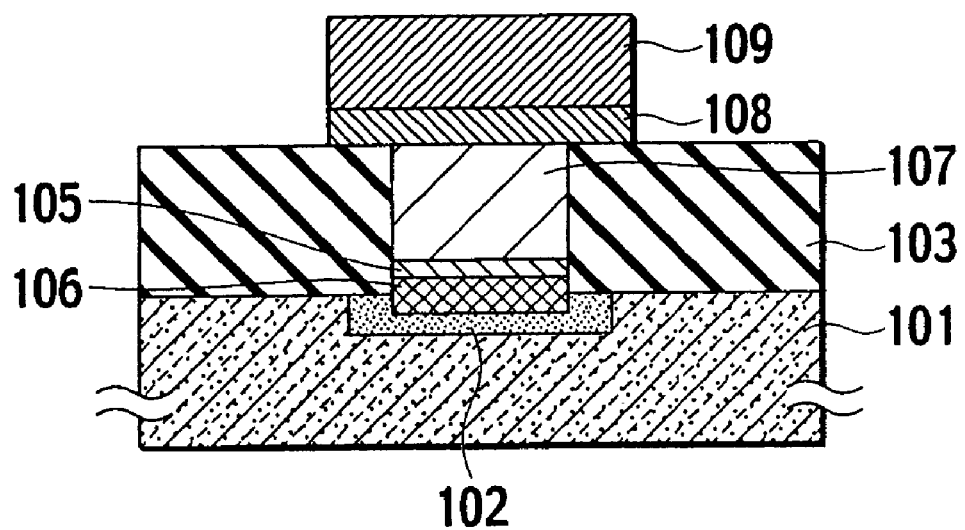

In FIG. 4B, the diffusion preventive layer material 127 and Al wiring material 128 are continuously etched by photolithography and dry etching with chloride-based reactive gas, to form a diffusion preventive layer 108 and Al wiring 109. At this time, the diffusion preventive layer 108 and Al wiring 109 are patterned to cover at least a top face of the plug 107. This completes the ohmic electrode shown in FIG. 1.

Second Embodiment

Figure 5:
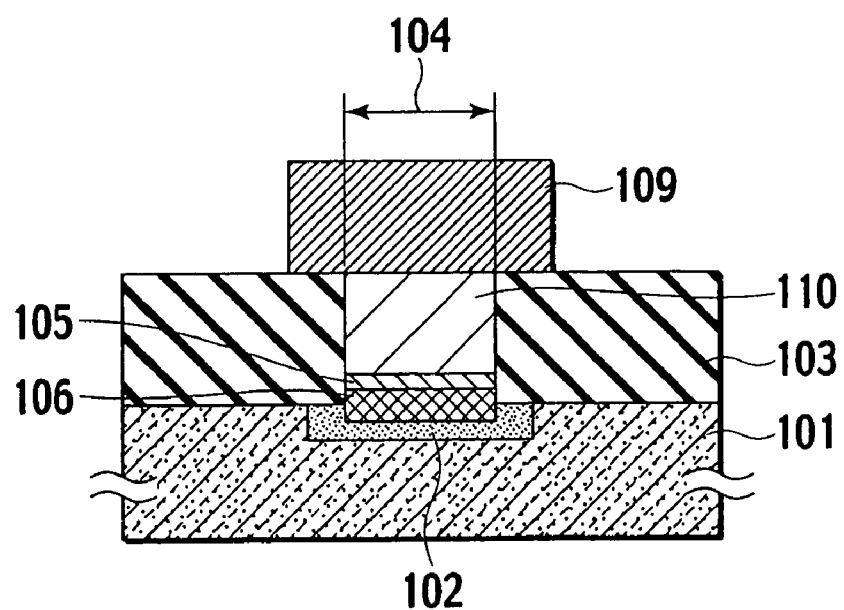
FIG. 5 is a sectional view partly showing an SiC ohmic electrode according to a second embodiment of the present invention.

FIG. 5 is a sectional view partly showing an SiC ohmic electrode according to a second embodiment of the present invention. This embodiment provides the plug of FIG. 1 with a diffusion preventive function and omits the diffusion preventive layer 108 of FIG. 1.

In FIG. 5, a diffusion preventive plug 110 fills a contact hole 104 and is in contact with a thermal reaction raw material 105 (if the thermal reaction raw material 105 is removed, a thermally-reacted layer 106). The diffusion preventive plug 110 is made of a conductive material having higher electromigration resistance than Al and is capable of preventing the diffusion of Al atoms even at high temperatures. It preferable that the material of the diffusion preventive plug 110 is substantially inactive with upper Al wiring 109 at high temperatures. Such a material is, for example, tungsten (W). Any other material is employable if suitable for this purpose of the present invention.

According to a modification of the second embodiment, a diffusion preventive layer 108 is formed under the Al wiring 109 like the first embodiment of FIG. 1. This modification may further improve the effect of preventing Al-atom diffusion at high temperatures.

(Method of Manufacturing Ohmic Electrode)

A method of manufacturing the ohmic electrode of FIG. 5 will be explained with reference to FIGS. 6A to 6D. Steps up to the formation of a thermal reaction raw material 105 and a thermally-reacted layer 106 at the bottom of a contact hole 104 may be the same as those explained with reference to FIGS. 2A to 3B of the first embodiment, and therefore, will be omitted.

Figure 6A:
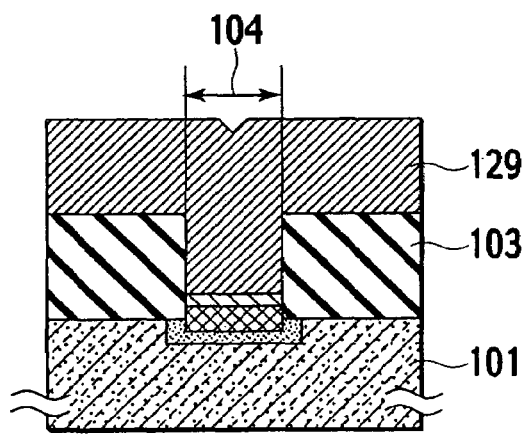
FIGS. 6A to 6D are sectional views for explaining a method of manufacturing ohmic electrode according to a second embodiment of the present invention.

After the completion of the steps up to FIG. 3B, a thick diffusion preventive plug material 129 of, for example, W (tungsten) is conformally deposited over the SiC substrate 101 as shown in FIG. 6A. The plug material 129 completely fills the contact hole 104. The deposition of the plug material 129 may be carried out by low-pressure (LP) CVD or electrolytic plating. If W is employed for the plug material 129, LPCVD employing $WF_6$ and $H_2$ as raw material is preferable. W (tungsten) by LPCVD is sometimes not adhesive to an insulating material, and therefore, may form a rough film on the side wall of the contact hole 104 formed in the thick insulating film 103. To prevent such a rough film, it is preferable to form a thin seed layer of TiW or Ti/TiN allover the SiC substrate 101 by DC magnetron spattering before conducting the LPCVD. In this case, the diffusion preventive plug 110 includes the seed layer.

Figure 6C:
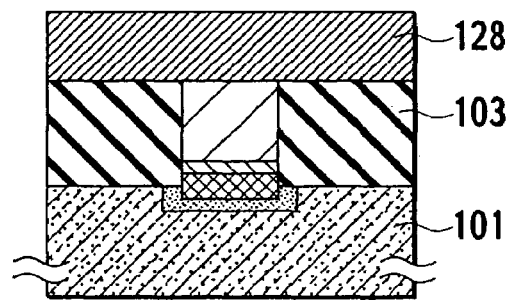
Figure 6B:
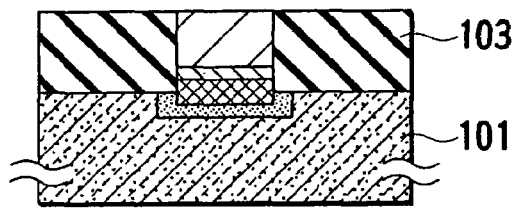

In FIG. 6B, the SiC substrate 101 is polished by chemical mechanical polishing (CMP) to remove the diffusion preventive plug material 129 (including the seed layer) from the surface of the insulating film 103, thereby forming the diffusion preventive plug 110. After the polishing, the SiC substrate 101 is sufficiently washed to remove abrasive particles and polished dust.

In FIG. 6C, Al wiring material 128 (for example, Al—Si eutectic alloy of 1 µm thick) is formed by DC magnetron spattering.

Figure 6D:
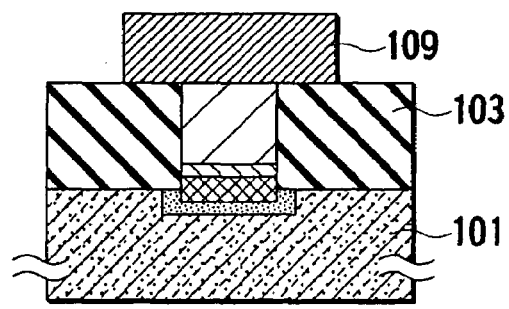

In FIG. 6D, Al wiring material 128 is patterned into Al wiring 109 by photolithography and dry etching employing chloride-based reactive gas. At this time, the Al wiring 109 is patterned to cover at least a top face of the plug 110. This completes the ohmic electrode shown in FIG. 5.

To test the heat resistance of ohmic electrodes formed according to the embodiments, three types of ohmic electrodes were prepared, tested, and compared. These ohmic electrodes were prepared on high-concentration impurity regions selectively formed at the surfaces of 4H—SiC substrates and were provided with the same thermally-reacted Ni layers. The prepared three ohmic electrodes were:

(a) an ohmic electrode based on the related art with Al wiring directly in contact with the thermally-reacted Ni layer;

(b) an ohmic electrode based on the first embodiment of the present invention with a plug 107 made of Cu formed by electrolytic plating and CMP, an electrolytic plating seed layer made of a Ti/TiN/Cu spattered film, and a diffusion preventive layer 108 made of a Ta/TaN multilayer film; and (c) an ohmic electrode based on the second embodiment of the present invention with a diffusion preventive plug 110 made of W formed by LPCVD and CMP and an LPCVD seed layer made of a Ti/TiN spattered film.

The thickness of a thermal reaction Ni raw material before forming the thermally-reacted layer of the ohmic electrode was 50 nm. After a heat treatment (contact annealing) for two minutes in an Ar atmosphere at 1000° C., the Ni raw material was completely transformed into a thermally-reacted layer.

Figure 7:
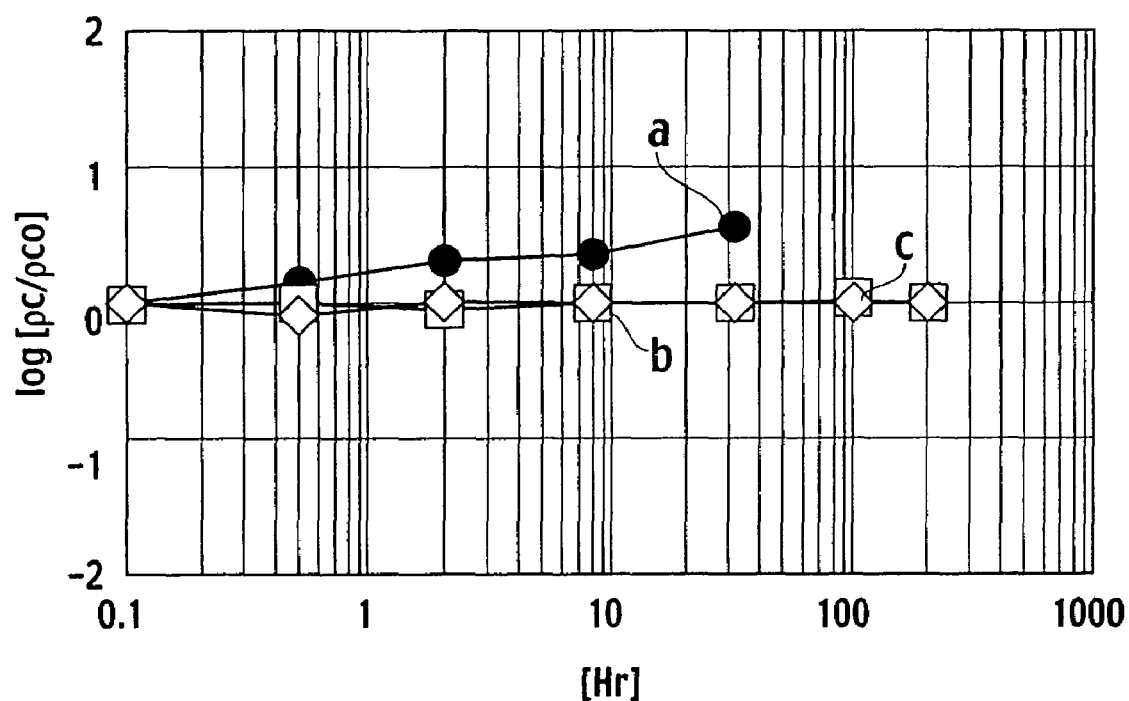
FIG. 7 shows changes in contact resistance ρc (at room temperature) when the three ohmic electrodes are intermittently left in an inert gas at 500° C.

FIG. 7 shows changes in contact resistance $\rho c$ (at room temperature) when the three ohmic electrodes are intermittently left in an inert gas at 500° C. In FIG. 7, black circles represent the ohmic electrode (a), white squares the ohmic electrode (b), and white rhombuses the ohmic electrode (c). Before the test, each of the ohmic electrodes showed a very low contact resistance $\rho c0$ of the $10^{-7}$ $\Omega cm^2$ level. As is apparent from FIG. 7, the contact resistance $\rho c$ of the ohmic electrode (a) of the related art increases as time passes, and after 32 hours, becomes about four times as large as the initial value. After 100 hours, the ohmic characteristic of the related art collapses into a rectifying characteristic. On the other hand, each of the ohmic electrodes (b) and (c) of the present invention shows no substantial change in the contact resistance and is stable at least for 150 hours. Namely, the first and second embodiments of the present invention can solve the problem of the related art that an n-type SiC ohmic electrode increases contact resistance if left at high temperatures for a long time.

The three ohmic electrodes were kept at 300° C. and were continuously subjected to a constant current stress that is greater than an actual stress by one digit. The ohmic electrode (a) of the related art sharply increased resistance and broke after about 2 minutes. The location of the breakage was Al wiring at a lower part of the side wall of a contact hole. On the other hand, the ohmic electrodes (b) and (c) of the embodiments showed no breakage even after three hours. Although the ohmic electrodes (b) and (c) showed a resistance increase from the initial value, the increase was below 5%. Namely, the first and second embodiments of the present invention can solve the problem of the related art that Al wiring connected to a contact of an ohmic electrode increases its resistance and finally ruptures at the side wall of a contact hole if the Al wiring passes a current for a long time at high temperatures.

As explained above, the first and second embodiments of the present invention fill a contact hole of an insulating film of an ohmic electrode with a contact plug that is made of a material of high electromigration resistance and large cross-sectional conductor area. As a result, the embodiments provide both the effects of reducing a current density in the contact hole and improving electromigration resistance. Namely, the embodiments greatly suppress electromigration to solve the conventional problem that Al wiring at the side wall of a contact hole passing a current at high temperatures increases resistance and finally breaks.

The present invention arranges an Al diffusion preventive layer between a contact plug and Al wiring of an ohmic electrode, or provides the contact plug itself with an Al diffusion preventive function, to block, at the top of the contact plug, the diffusion of Al atoms from the Al wiring at high temperatures. This prevents the phenomenon that Al atoms penetrate as acceptors into an $n^+$region formed at the bottom of the contact plug and reduce an effective donor concentration in the $n^+$region. In this way, the present invention can solve the conventional problem that a contact of an ohmic electrode gradually increases contact resistance when left (or operated) for a long time at high temperatures.

The entire contents of Japanese patent application P2004-76680 filed Mar. 17th, 2004 are hereby incorporated by reference.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A method of manufacturing an ohmic electrode, comprising:

forming a high-concentration impurity region in an area at a surface of an SiC substrate by implanting conductive impurities into the area;

forming an insulating film over the surface of the SiC substrate including the high-concentration impurity region;

opening a contact hole through the insulating film, to expose a surface of the high-concentration impurity region;

arranging a conductive thermal reaction raw material in the contact hole over the surface of the high-concentration impurity region;

forming a thermally-reacted layer from the thermal reaction raw material by heat-treating the SiC substrate in a non-oxidizing atmosphere, the thermally-reacted layer being conductive and interposed between the thermal reaction raw material and the high-concentration impurity region;

forming a plug by filling the contact hole with a conductive material up to the surface of the insulating film, the plug preventing the diffusion of metal atoms of a metal wiring; and forming the metal wiring to cover the plug.

2. The method of claim 1, wherein forming a plug by filling the contact hole with a conductive material up to the surface of the insulating film comprises:

depositing the conductive material in the contact hole and over the surface of the insulating film by low-pressure chemical vapor deposition or by electrolytic plating; and polishing the deposited conductive material by chemical mechanical polishing to expose the surface of the insulating film.

3. The method of claim 1, wherein forming a plug by filling the contact hole with a conductive material up to the surface of the insulating film comprises:

after forming the thermally-reacted layer, filling the contact hole with the conductive material up to the surface of the insulating film to form the plug; and forming an metal diffusion preventive layer to cover the contact hole.

4. The method of claim 1, wherein forming a plug by filling the contact hole with a conductive material up to the surface of the insulating film comprises:

depositing an metal diffusion preventive material in the contact hole and over the surface of the insulating film by low-pressure chemical vapor deposition; and polishing the deposited metal diffusion preventive material by chemical mechanical polishing to expose the surface of the insulating film.

5. The method of claim 1, further comprising before the forming a plug by filling the contact hole with a conductive material up to the surface of the insulating film:

forming an adhesion-deposition promoting layer that promotes deposition of the plug as well as adhesion of the plug to the insulating film and the thermal reaction layer.

6. The method of claim 3, wherein the forming a metal diffusion preventive layer to cover the contact hole comprises:

forming an adhesion promoting layer that promotes adhesion between the diffusion preventive layer and the insulating film, and forming a metal diffusion preventive layer on the adhesion promoting layer to cover the contact hole.

* * * * *